United States Patent
Prudham

[11] Patent Number: 6,043,574
[45] Date of Patent: Mar. 28, 2000

[54] TWO-PHASE MOTOR, PARTICULARLY A TIME PIECE MOTOR OR A MOTOR FOR DRIVING THE HAND OF A DISPLAY

[75] Inventor: Daniel Prudham, Thise, France

[73] Assignee: Sonceboz S.A., Sonceboz, Switzerland

[21] Appl. No.: 08/894,231

[22] PCT Filed: Nov. 29, 1996

[86] PCT No.: PCT/FR96/01904

§ 371 Date: Oct. 2, 1997

§ 102(e) Date: Oct. 2, 1997

[87] PCT Pub. No.: WO97/23943

PCT Pub. Date: Jul. 3, 1997

[30] Foreign Application Priority Data

Dec. 22, 1995 [FR] France ................... 95 15438

[51] Int. Cl.$^7$ .......... H02K 37/00; H02K 21/12; H02K 1/12
[52] U.S. Cl. .......... 310/49 R; 310/254; 310/156
[58] Field of Search ................ 310/49 R, 254, 310/258, 266, 156, 153, 74, 162, 216

[56] References Cited

U.S. PATENT DOCUMENTS 4,475,051 10/1984 Chai et al. ............ 310/49
5,521,451 5/1996 Oudet et al. .......... 310/266
5,710,474 1/1998 Mulgrave ............. 310/254
5,780,944 7/1998 Sakamoto ........... 310/49 R
5,880,551 3/1999 Prudham ............ 310/254

FOREIGN PATENT DOCUMENTS 2201575 4/1974 France.

*Primary Examiner*—Thomas M. Dougherty
*Assistant Examiner*—Dang Dinh Le
*Attorney, Agent, or Firm*—Oblon, Spivak, McClelland, Maier & Neustadt, P.C.

[57] ABSTRACT

A two-phase motor formed by a stator part excited by electric coils and a magnetized rotor. The rotor has N pairs of poles which are radially magnetized in alternate directions, N being equal to 3 or 5. The stator part has at least two W-shaped circuits comprising each an electric coil surrounding the central leg. The "W" circuits are so arranged that when one of the central legs faces a magnetic transition, the other central leg faces a magnetic pole. The polar opening outs of the legs of a "W" circuit are angularly spaced by $\pi/4$. The polar opening outs of the central legs of the two "W" circuits belonging to different phases are angularly spaced apart by an angle which is substantially equal to $\pi/2 \pm k.\pi/N$, where N is the number of pairs of magnetic poles, that is 3 or 5, and k is equal to 0, 1 or 2.

18 Claims, 6 Drawing Sheets

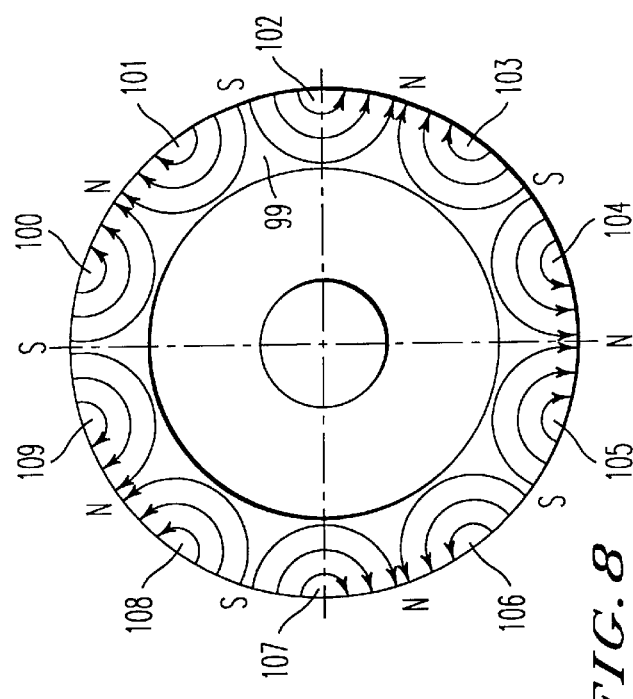
FIG. 8
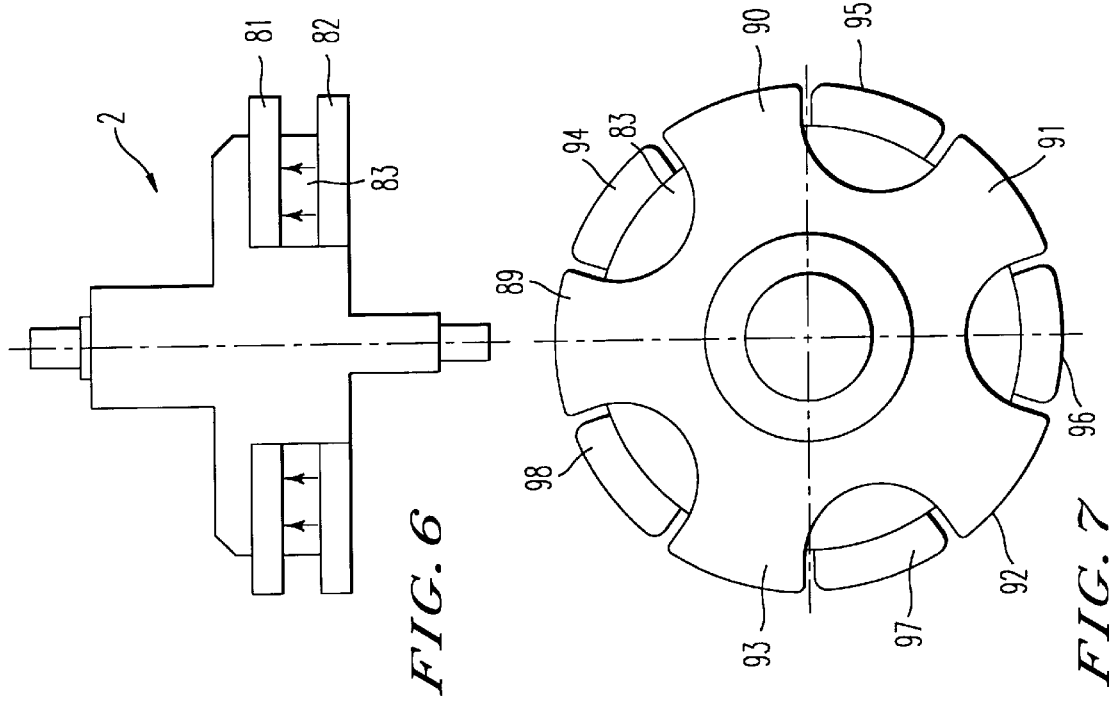
FIG. 6
FIG. 7

TWO-PHASE MOTOR, PARTICULARLY A TIME PIECE MOTOR OR A MOTOR FOR DRIVING THE HAND OF A DISPLAY

BACKGROUND OF THE INVENTION

Field of the Invention

The present invention relates to a two-phase electric motor, especially a motor for a counter mechanism or a motor for driving an indicator pointer.

SUMMARY OF THE INVENTION

Such motors are described, for example, in European Patent EP 587,685 of the Applicant. The object of the invention is to improve such motors so as to increase the torque and eliminate the magnetic shunt without losing the advantage of simplicity of manufacture and the possibilities of integrating associated mechanisms such as step-down gears.

To this end the invention relates to a two-phase motor formed by a stator part excited by electric coils and by a magnetized rotor provided with N pairs of poles magnetized radially in alternate directions, N being equal to 3 or to 5. The stator part is provided with at least two W-shaped circuits, each having an electric coil surrounding the central leg. The W circuits are disposed such that when one of the central legs is facing a magnetic transition, the other central leg is facing a magnetic pole. The pole shoes of the legs of a W circuit being spaced angularly by $\pi/4$ and the pole shoes of the central legs of two W circuits belonging to different phases being spaced angularly by an angle substantially equal to $\pi/2 \pm k \cdot \pi/N$, where N is the number of pairs of magnetic poles, in this case 3 or 5, and k is equal to 0, 1 or 2.

Such a motor meets the objectives of the invention by virtue of an increased number of active teeth (6 instead of 4) and by virtue of a shorter path of the lines of flux in air. The "W" shape of the stator circuit ensures closing of the lines of flux between the central pole accommodating the coil and the two adjacent poles.

Advantageously, the two "W" circuits have a common leg. The stator can therefore be constructed as a single piece, thus eliminating any problem of angular positioning that is found with stators formed from a plurality of pieces fixed on one support.

In a preferred embodiment, the invention relates to a motor of low assembly cost and very small thickness.

According to a first embodiment, the outer legs of the two "W" circuits are connected by a yoke shaped like the arc of a circle, the yoke advantageously being provided with stator teeth having a spacing of $\pi/4$ degrees. This embodiment permits construction of a motor with a smaller number of components, namely a rotor, a stator formed by a single piece supporting only two electric coils.

The prior-art step motors also exhibit jerky displacement, due to the fact that a magnetized pole of the rotor assumes a preferential equilibrium position when it is placed facing a stator tooth or when a transition between two magnetic poles is facing a stator tooth. Consequently the relaxing torque constitutes a periodic function of the angular position, with frequency depending on the number of magnetic poles and on the number of stator poles. Attempts have been made in the prior art to "smooth" this function by increasing the number of poles. However, this entails greater mechanical complexity and high manufacturing and assembly cost.

A second object of the present invention is to remedy this drawback by proposing a construction that permits substantial limitation of the relaxing torque with a reasonable number of magnetic and stator poles.

To this end, the invention relates to a preferred embodiment using four "W" circuits, the adjacent legs of which are common, thus forming an 8-pole stator. The central legs of the diametrically opposite "W" circuits support coils of like phase.

This structure permits considerable reduction of the relaxing torque by canceling out harmonics 2 and 4 of the function (relaxing torque, angular position). The motor according to the invention therefore exhibits smooth displacement despite the reduced number of magnetic or stator poles.

Advantageously, the stator comprises a single piece cut such that it has two pairs of diametrically opposite "W" circuits, the pole ends of which are angularly equidistant. Advantageously, the legs accommodating the electric coils extend into a hollow central part, the dimensions of which make it possible to introduce an electric coil into the plane of the legs and then move it sideways to position it around the corresponding leg.

The coils can therefore be manufactured separately by processes more economical than winding around a complex stator part, and can then be slipped onto the corresponding legs.

The stator can be manufactured by simple and inexpensive processes. The fact that it is formed by a cutting as a single piece circumvents the problems of assembly precision and loss of adjustment.

Preferably, the legs supporting the electric coils extend radially. According to a specific embodiment, the stator comprises a stack of thin laminations. This embodiment makes it possible to use inexpensive machining techniques for cutting the stator and to improve the magnetic performances of the stator.

Preferably, the front end of the pole shoe is situated in the plane of the inner front face of the coil.

According to a specific embodiment, the rotor is formed by a magnet magnetized in a direction perpendicular to the plane of the stator and placed between two slotted disks having offset teeth.

According to a specific embodiment, the two-phase motor is provided with an auxiliary magnetic shunt, advantageously a magnetic shunt of soft material coaxial with the rotor.

According to a first embodiment, the magnetic shunt is a cylindrical piece in the form of a ring. This ring can be fixed relative to the rotor or can be integral with the magnet.

According to a second embodiment, the magnetic shunt is a cylindrical piece in the form of a ring having grooves forming teeth facing the stator teeth.

BRIEF DESCRIPTION OF THE DRAWINGS

The invention will be better understood by reading the description hereinafter, given with reference to the attached drawings wherein:

FIG. 6 represents a cross-sectional view of a rotor for the motor according to the invention;

FIG. 7 represents a top view of the said rotor;

FIG. 8 represents a cross-sectional view of another embodiment of the rotor.

DISCUSSION OF THE PREFERRED EMBODIMENTS

Figure 1:
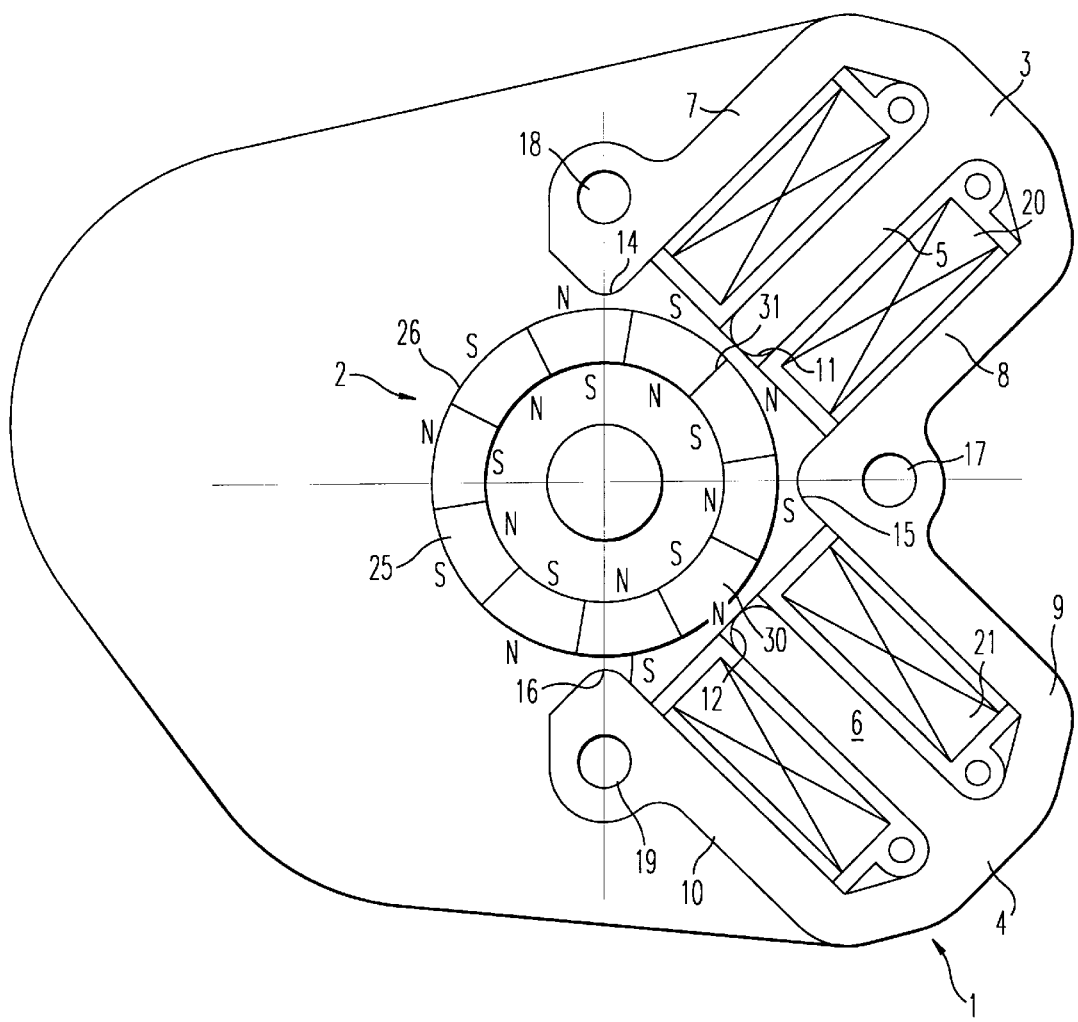
FIGS. 1 and 2 respectively represent top and cross-sectional views of a first embodiment of a motor according to the invention.
Figure 2:
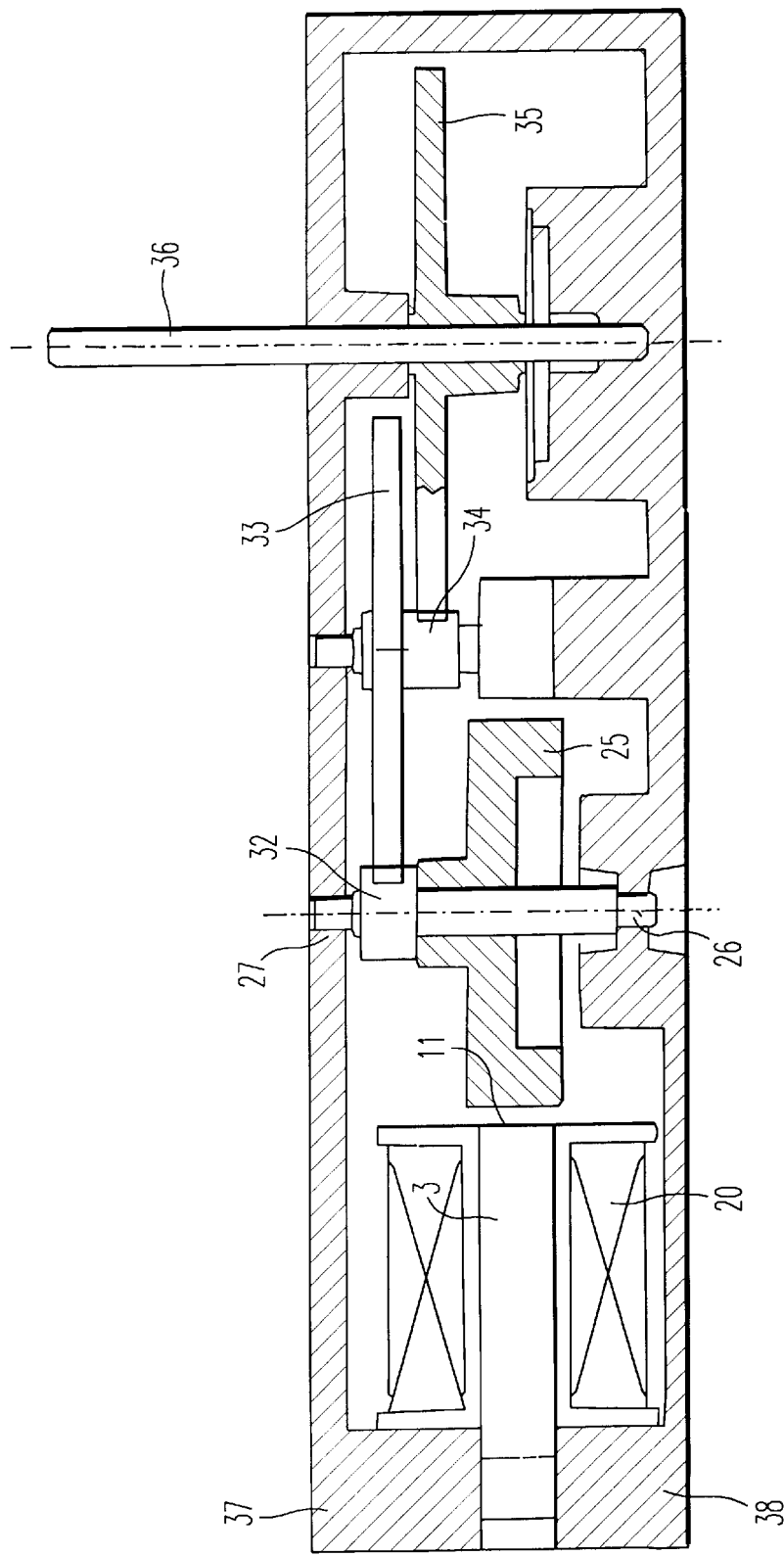

FIGS. 1 and 2 respectively represent top and cross-sectional views of a motor according to the invention. The motor comprises a stator (1) and a rotor (2).

The stator (1) is cut from sheet metal with a thickness of 2 millimeters, or is made by stacking a plurality of metal laminations of magnetically soft material. The stator is provided with two "W" circuits (3, 4), each having a central leg (5, 6) and two side legs (7, 8 and 9, 10). The central legs (5, 6) are each terminated by respective pole shoes (11, 12). The side legs are also provided with pole shoes (14 to 16), the two legs (8, 9) belonging respectively to the first "W" circuit (3) and to the second "W" circuit (4) being provided with a common pole shoe in the practical example described here.

The stator (1) is also provided with holes (17, 18, 19), through which a means such as screws or rivets for fixation to a support can be passed.

The central legs (5, 6) accommodate electric coils (20, 21) respectively. These two legs (5, 6) are oriented radially.

The rotor (2) is provided with 5 pairs of magnetic poles. It is formed by a cylindrical piece (25), magnetized radially to present alternating SOUTH and NORTH poles at the outer surface (26). The magnetized part can be formed by a combination of thin magnets in the form of tiles bonded to a cylindrical core or by magnetization of tubular sectors.

Yet another embodiment consists in magnetizing a cylindrical piece in scallop-shaped profiles at the surface, such that two opposite poles are formed by adjacent elements of peripheral surface, connected by a zone in the form of an arc of a circle extending to the inside of the cylindrical element.

The rotor (2) is supported in known manner by pivots (28, 27) as shown in FIG. 2.

The central legs (5, 6) of the two opposite phases supporting the electric coils (20, 21) are oriented such that, when a magnetic pole (30) is facing one of the pole shoes (12), the other pole shoe (11) is facing a transition (31).

The rotor (2) is provided with a slotted ring (32) suitable for driving a gear train (33 to 35). This gear train transmits the rotary movement to an output shaft (36).

In the example described, the stator (1) is housed in a case formed from two complementary shells (37, 38), which also provide support for the shafts of the gear train (32 to 35).

Figure 3:
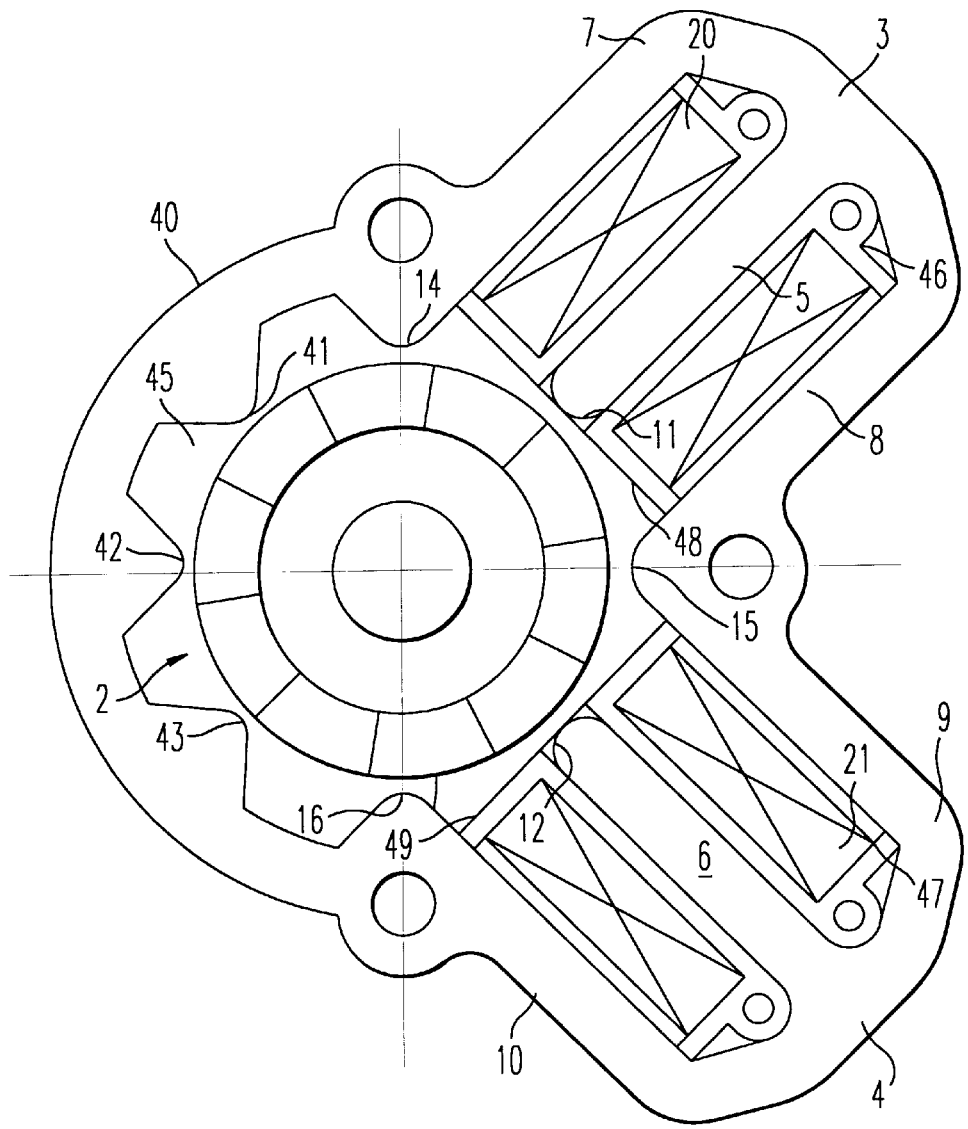
FIG. 3 represents a top view of a second embodiment of the motor according to the invention.

FIG. 3 represents an embodiment different from that described in the foregoing in that the pole shoes (14, 16) forming the ends of the outer legs (7, 10) of the two circuits are joined by a yoke (40) provided with polar teeth (41 to 43). The complete unit formed by the "W" circuits (3, 4) and by the yoke (40) is cut from a single piece of magnetically soft material or from a plurality of laminations forming a stack.

The central part (45) of the stator (1) is hollow. The electric coils (20, 21) are introduced by moving them first in a direction perpendicular to the stator plane, which corresponds to the plane of FIG. 3, then by moving them in radial direction in order to slip the coil around one of the central legs (5, 6). Of course, this operation is completed before the rotor (2) is installed. The coil can be formed on a core (46, 47), the cross section of which is complementary to that of the legs (5, 6), the said core having a front face (48, 49) flush with the end of the pole shoe (11, 12) of the corresponding leg (5, 6).

Figure 4:
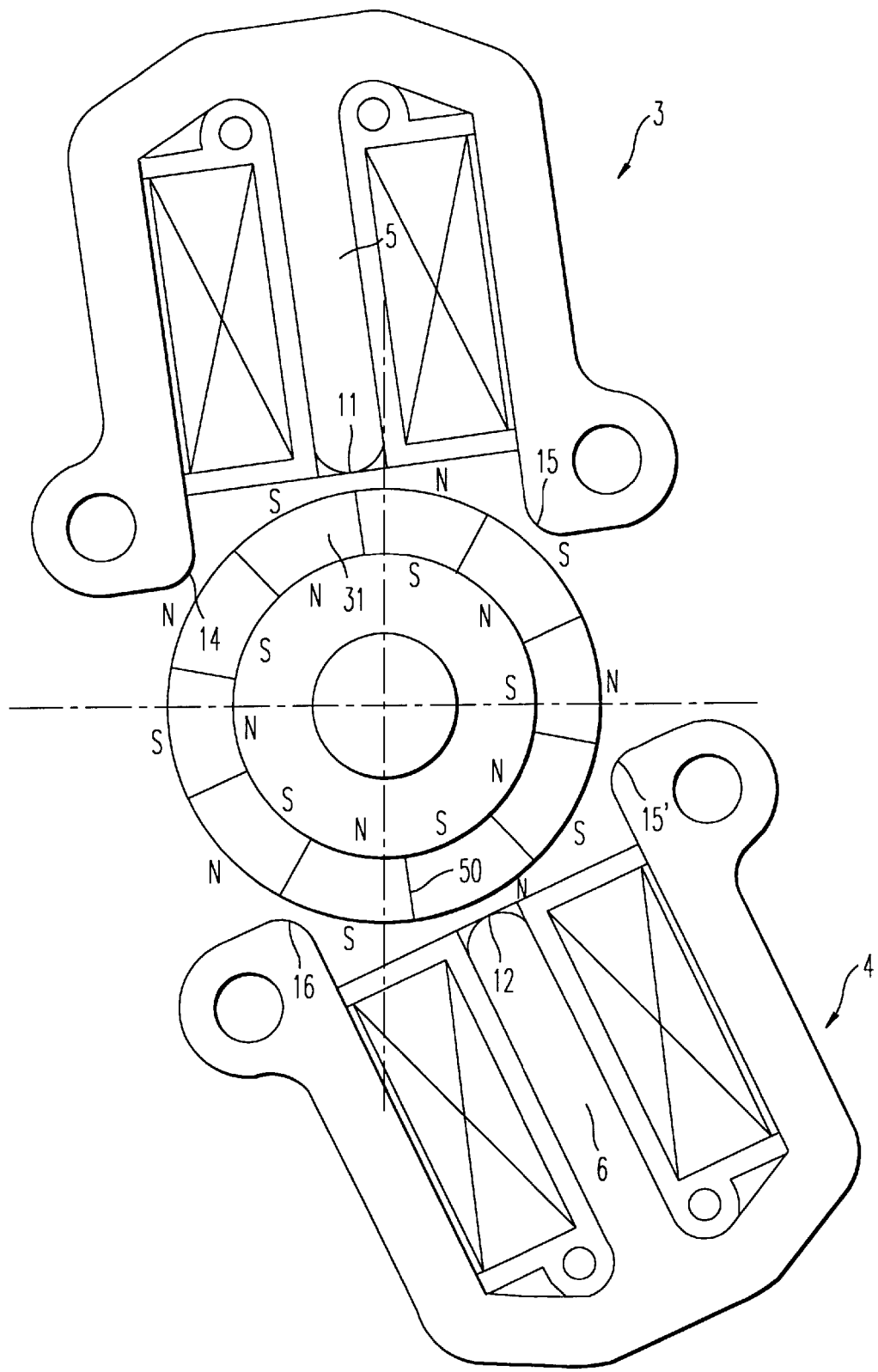
FIG. 4 represents a top view of a third embodiment of the motor according to the invention.

FIG. 4 represents a top view of a third embodiment different from the foregoing embodiments in that the "W" circuits (3, 4) are separate. They are positioned such that, when the pole shoe (11) of the central leg (5) of one of the "W" circuits (3) is facing a magnetic transition (31), the pole shoe (12) of the central leg (6) of the other "W" circuit (4) is facing a magnetic pole (50).

Figure 5:
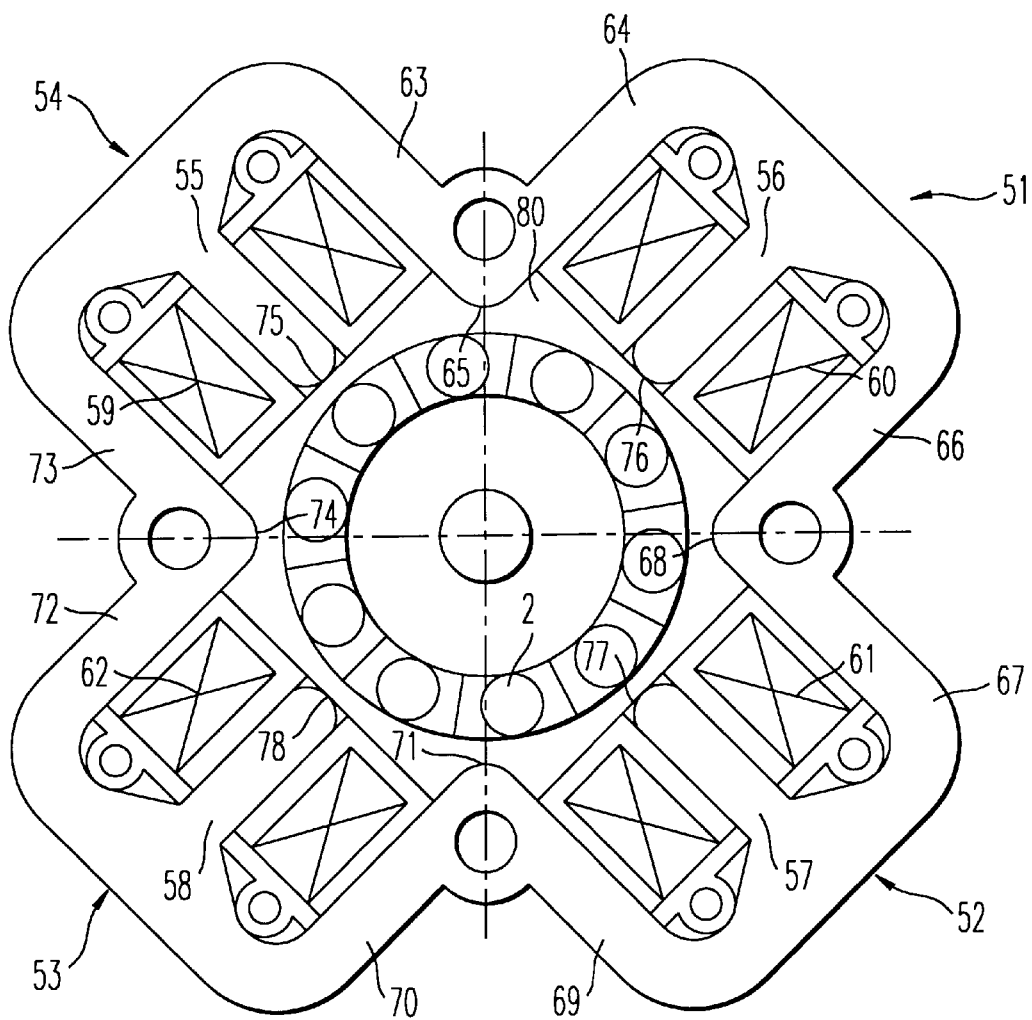
FIG. 5 represents a top view of a fourth embodiment of the motor according to the invention.

FIG. 5 shows a top view of a fourth embodiment different from the foregoing embodiments in that it has four "W" circuits (51, 52, 53, 54). Two diametrically opposite "W" circuits have like phase. The central legs (55, 56, 57, 58) each support an electric coil (59, 60, 61, 62). Two successive side legs (63, 64) , (66, 67), (69, 70), (72, 73) represent respective common pole shoes (65, 68, 71, 74). The successive pole shoes (65, 68, 71, 74, 75 to 78) are angularly separated by $\pi/4$.

The stator provided with the four "W" circuits (51 to 54) is cut from a single piece or from a stack of pieces, defining a central hollow (80) with dimensions and shape permitting coils (59 to 62) to be slipped onto the central legs (55 to 58).

FIGS. 6 and 7 respectively represent cross-sectional and top views of a rotor for the motor according to the invention. The rotor (2) is formed by two slotted disks provided with offset teeth (81, 82), between which there is positioned a magnet (83) magnetized in a direction perpendicular to the central plane of the stator. The teeth (89 to 93) of one of the slotted disks (81) coincide with slots formed between two successive teeth (94 to 98) of the other slotted disk (82). Each of the slotted disks (81, 82) is provided with 5 teeth separated by 5 slots.

FIG. 8 represents a cross-sectional view of another rotor embodiment. The rotor has a ring (99) of magnetically soft material, provided with ten zones (100 to 109) magnetized in scallop-shaped profiles such that they exhibit alternating poles at the surface of the said ring (99).

The description of the invention hereinabove is given by way of non-limitative examples. The person skilled in the art will be able to construct different stator or rotor forms in accordance with the invention.

I claim:

1. A two-phase motor formed by a stator part excited by electric coils and by a magnetized rotor, characterized in that the rotor is provided with N pairs of poles magnetized radially in alternate directions, N being equal to 3 or to 5, and in that the stator part is provided with at least two "W"-shaped circuits, each having an electric coil surrounding a central leg and pole shoes, the "W" circuits being disposed such that when one of the central legs is facing a magnetic transition, the other central leg is facing a magnetic pole, the pole shoes of the legs of a "W" circuit being spaced angularly by $\pi/4$ and the pole shoes of the central legs of two "W" circuits belonging to different phases being spaced angularly by an angle substantially equal to $\pi/2 \pm k \cdot \pi/N$, where N is the number of pairs of magnetic poles, in this case 3 or 5, and k is equal to 0, 1 or 2.

2. A two-phase motor according to claim 1, characterized in that two "W" circuits have a common pole shoe.

3. A two-phase motor according to claim 2, characterized in that outer legs of the two "W" circuits are connected by a yoke shaped like the arc of a circle.

4. A two-phase motor according to claim 2, characterized in that the stator has a hollow central part, having dimensions which make it possible to introduce an electric coil into a plane of a legs and then move it sideways to position it around the corresponding leg.

5. A two-phase motor according to claim 2, characterized in that the central legs supporting the electric coils extend radially.

6. A two-phase motor according to claim 1, characterized in that outer legs of the two "W" circuits are connected by a yoke shaped like the arc of a circle.

7. A two-phase motor according to claim 6, characterized in that the yoke is provided with stator teeth having a spacing of π/4 degrees.

8. A two-phase motor according to claim 7, characterized in that the stator has a hollow central part, having dimensions of which make it possible to introduce an electric coil into a plane of a legs and then move it sideways to position it around the corresponding leg.

9. A two-phase motor according to claim 6, characterized in that the stator has a hollow central part, having dimensions which make it possible to introduce an electric coil into a plane of a legs and then move it sideways to position it around the corresponding leg.

10. A two-phase motor according to claim 6, characterized in that the central legs supporting the electric coils extend radially.

11. A two-phase motor according to claim 1, characterized in that the stator comprises a single piece cut such that it has two pairs of diametrically opposite "W" circuits the pole shoes of which are angularly equidistant with a spacing of π/4.

12. A two-phase motor according to claim 11, characterized in that the stator has a hollow central part, having dimensions which make it possible to introduce an electric coil into a plane of a legs and then move it sideways to position it around the corresponding leg.

13. A two-phase motor according to claim 1, characterized in that the stator has a hollow central part, having dimensions which make it possible to introduce an electric coil into a plane of the legs and then move it sideways to position it around a corresponding leg.

14. A two-phase motor according to claim 1, characterized in that the central legs supporting the electric coils extend radially.

15. A two-phase motor according to claim 1, characterized in that the stator comprises a stack of thin laminations.

16. A two-phase motor according to claim 1, characterized in that an front end of the pole shoe is situated in a plane of the inner front face of the electric coil.

17. A two-phase motor according to claim 1, characterized in that the rotor is formed by a magnet magnetized in a direction perpendicular to a plane of the stator and placed between two slotted disks having offset teeth.

18. A two-phase motor according to claim 1, characterized in that the rotor is formed by a ring magnetized in scallop-shaped profiles.

* * * * *